United States Patent
Huang et al.

(10) Patent No.: US 9,221,676 B2
(45) Date of Patent: *Dec. 29, 2015

(54) INTERNAL ELECTRICAL CONTACT FOR ENCLOSED MEMS DEVICES

(71) Applicant: InvenSense, Inc., San Jose, CA (US)

(72) Inventors: Kegang Huang, Fremont, CA (US); Jongwoo Shin, Pleasanton, CA (US); Martin Lim, San Mateo, CA (US); Michael Julian Daneman, Campbell, CA (US); Joseph Seeger, Menlo Park, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/590,839

(22) Filed: Jan. 6, 2015

(65) Prior Publication Data

US 2015/0336792 A1 Nov. 26, 2015

Related U.S. Application Data

(60) Continuation of application No. 14/456,973, filed on Aug. 11, 2014, now Pat. No. 8,945,969, which is a continuation of application No. 14/033,366, filed on Sep. 20, 2013, now Pat. No. 8,822,252, which is a division of application No. 13/754,462, filed on Jan. 30, 2013, now Pat. No. 8,564,076.

(51) Int. Cl.
*B81C 1/00* (2006.01)
(52) U.S. Cl.
CPC .................. *B81C 1/00301* (2013.01)
(58) Field of Classification Search
CPC ................. B81C 1/00301; B81C 1/00269
USPC ........................................................ 438/51
See application file for complete search history.

(56) References Cited

U.S. PATENT DOCUMENTS

| | | | |
|---|---|---|---|
| 6,936,918 | B2 | 8/2005 | Harney et al. |
| 7,071,031 | B2 | 7/2006 | Pogge et al. |

(Continued)

FOREIGN PATENT DOCUMENTS

| | | |
|---|---|---|
| CN | 102798489 | 11/2012 |
| FR | 2977885 | 1/2013 |

OTHER PUBLICATIONS

Pieters et al., "Integration and Packaging MEMS Directly Above Active CMOS" (Jun. 2007) IEEE Xplore Digital Library.

(Continued)

*Primary Examiner* — Lex Malsawma
(74) *Attorney, Agent, or Firm* — Sawyer Law Group, P.C.

(57) ABSTRACT

A method of fabricating electrical connections in an integrated MEMS device is disclosed. The method comprises forming a MEMS wafer. Forming a MEMS wafer includes forming one cavity in a first semiconductor layer, bonding the first semiconductor layer to a second semiconductor layer with a dielectric layer disposed between the first semiconductor layer and the second semiconductor layer, and etching at least one via through the second semiconductor layer and the dielectric layer and depositing a conductive material on the second semiconductor layer and filling the at least one via. Forming a MEMS wafer also includes patterning and etching the conductive material to form one standoff and depositing a germanium layer on the conductive material, patterning and etching the germanium layer, and patterning and etching the second semiconductor layer to define one MEMS structure. The method also includes bonding the MEMS wafer to a base substrate.

14 Claims, 6 Drawing Sheets

(56) References Cited

U.S. PATENT DOCUMENTS

| | | | |
|---|---|---|---|
| 7,291,513 B2 | 11/2007 | Ouellet et al. | |
| 7,675,162 B2 | 3/2010 | Foster et al. | |
| 7,964,428 B2 | 6/2011 | Breng et al. | |
| 7,982,291 B2 | 7/2011 | Kuisma | |
| 8,012,785 B2 | 9/2011 | Liang et al. | |
| 8,084,332 B2 | 12/2011 | Nasiri et al. | |
| 8,093,119 B2 | 1/2012 | Hsieh et al. | |
| 8,119,498 B2 | 2/2012 | Mengi et al. | |
| 8,124,435 B2 | 2/2012 | Kuisma | |
| 8,217,474 B2 | 7/2012 | Lee et al. | |
| 8,450,816 B2 | 5/2013 | Kuisma | |
| 8,564,076 B1 * | 10/2013 | Huang et al. | 257/414 |
| 8,822,252 B2 | 9/2014 | Huang et al. | |
| 2002/0079550 A1 | 6/2002 | Daneman et al. | |
| 2006/0163698 A1 | 7/2006 | Araki | |
| 2008/0079120 A1 | 4/2008 | Foster et al. | |
| 2010/0065858 A1 | 3/2010 | Sugiura | |
| 2010/0096713 A1 | 4/2010 | Jung | |
| 2010/0140670 A1 | 6/2010 | Peczalski et al. | |
| 2011/0127620 A1 | 6/2011 | Wang et al. | |
| 2011/0155548 A1 | 6/2011 | Foster et al. | |
| 2012/0001276 A1 | 1/2012 | Huang et al. | |
| 2012/0025389 A1 | 2/2012 | Chu et al. | |
| 2012/0049299 A1 | 3/2012 | Chou | |
| 2012/0074554 A1 | 3/2012 | Cheng et al. | |
| 2012/0086126 A1 | 4/2012 | Shu et al. | |
| 2012/0086127 A1 | 4/2012 | Shu et al. | |
| 2012/0094435 A1 | 4/2012 | Nasiri et al. | |
| 2013/0043510 A1 | 2/2013 | Shu et al. | |

OTHER PUBLICATIONS

Parameswaran et al., "A Merged MEMS-CMOS Processing using Silicon Wafer Bonding" (Dec. 1995) Microsystems Technology Laboratories.

The Extended European Search Report for European Application No. 14153050.1, mailed Sep. 3, 2014.

* cited by examiner

INTERNAL ELECTRICAL CONTACT FOR ENCLOSED MEMS DEVICES

CROSS-REFERENCE TO RELATED APPLICATION

Under 35 U.S.C. 120, this application is a Continuation Application and claims priority to U.S. application Ser. No. 14/456,973, filed Aug. 11, 2014, entitled "INTERNAL ELECTRICAL CONTACT FOR ENCLOSED MEMS DEVICES," which is a Continuation Application and claims priority to U.S. application Ser. No. 14/033,366, filed Sep. 20, 2013, entitled "INTERNAL ELECTRICAL CONTACT FOR ENCLOSED MEMS DEVICES" which is a Divisional Application and claims priority to U.S. patent application Ser. No. 13/754,462, filed on Jan. 30, 2013, entitled "INTERNAL ELECTRICAL CONTACT FOR ENCLOSED MEMS DEVICES," all of which are incorporated herein by reference.

FIELD OF THE INVENTION

The present invention relates generally to MEMS devices and more specifically to providing electric contact of the enclosure of the MEMS devices.

BACKGROUND

MEMS devices are utilized in a variety of environments. In such devices a handle layer is normally required to be electrically grounded to provide an electric shield for low noise performance. The electrical connection to the handle layer is provided by a wire bond. However, the wire bond requires vertical space and increases overall thickness of the MEMS device when packaged. Accordingly, what is desired is a MEMS device and method where the wire bond is not necessary.

The MEMS device and method for providing electrical connection to the handle layer should be simple, easily implemented and adaptable to existing environments. The present invention addresses such a need.

SUMMARY

A method of fabricating electrical connections in an integrated MEMS device is disclosed. The method comprises forming a MEMS wafer. Forming a MEMS wafer includes forming one cavity in a first semiconductor layer, bonding the first semiconductor layer to a second semiconductor layer with a dielectric layer disposed between the first semiconductor layer and the second semiconductor layer, and etching at least one via through the second semiconductor layer and the dielectric layer and depositing a conductive material on the second semiconductor layer and filling the at least one via. Forming a MEMS wafer also includes patterning and etching the conductive material to form one standoff and depositing a germanium layer on the conductive material, patterning and etching the germanium layer, and patterning and etching the second semiconductor layer to define one MEMS structure. The method also includes bonding the MEMS wafer to a base substrate.

DETAILED DESCRIPTION OF PREFERRED EMBODIMENTS

The present invention relates generally to MEMS devices and more specifically to electric coupling for enclosed CMOS-MEMS devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but are not limited to gyroscopes, accelerometers, magnetometers, pressure sensors, and radio-frequency components. Silicon wafers containing MEMS structures are referred to as MEMS wafers.

In the described embodiments, MEMS device may refer to a semiconductor device implemented as a micro-electro-mechanical system. MEMS structure may refer to any feature that may be part of a larger MEMS device. An engineered silicon-on-insulator (ESOI) wafer may refer to a SOI wafer with cavities beneath the silicon device layer or substrate. Handle wafer typically refers to a thicker substrate used as a carrier for the thinner silicon device substrate in a silicon-on-insulator wafer. Handle substrate and handle wafer can be interchanged.

In the described embodiments, a cavity may refer to an opening or recession in a substrate wafer and enclosure may refer to a fully enclosed space.

To describe the features of the invention in more detail, apparatus and fabrication methods to achieve a direct electric coupling of handle layer, device layer and base substrate of a MEMS device without a metal wire-bond are disclosed.

Figure 1:
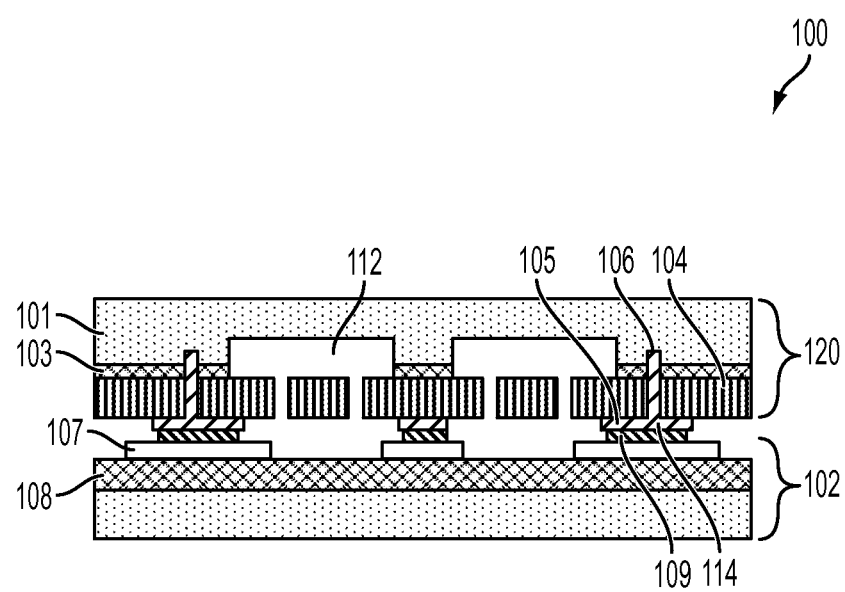
FIG. 1 is a diagram which illustrates a cross-section of the bonded MEMS-base substrate device with an internal direct electric coupling in accordance with a first embodiment.

FIG. 1 is a diagram which illustrates a cross-section of the bonded MEMS-base substrate device with an internal direct electric coupling in accordance with a first embodiment. An engineered silicon-on-insulator (ESOI) substrate 120 includes a handle layer 101 with cavities 112 and a device layer 104, fusion bonded together with a thin dielectric film 103 (such as silicon oxide) in between the device layer 104 and handle layer 101. An electrical connection between the handle layer 101 and the device layer 104 may be achieved by etching one or more vias 106 through the device layer 104 and the thin dielectric layer 103 into the handle layer 101 and by filling the vias 106 with a conductive material 114, such as polysilicon, tungsten, titanium, titanium nitride, aluminum, or germanium. The MEMS substrate is considered complete after a germanium (Ge) 109 and standoffs 105 comprising conductive material 114 are formed and MEMS actuator structures are patterned and etched in device layer 104. Alternately, the standoff can be formed from both the conductive material 114 and a portion of the device layer 104 by partially etching into the device layer during standoff formation. In other embodiments the base substrate can comprise CMOS circuitry.

The MEMS to a base substrate integration may be provided by eutectic bonding of germanium 109 of the MEMS substrate with aluminum 107 of a base substrate 102, where the AlGe bond provides the direct electrical coupling between MEMS substrate (handle 101 and device 104) and base substrate 102. In addition, AlGe bond provides hermetic vacuum seal of the MEMS device.

FIGS. 2A-2E are diagrams which illustrate a series of cross-sections illustrating processing steps to build the electric coupling from handle layer 101 to MEMS device layer 104 ready to bond to a base substrate 102 shown in FIG. 1.

Figure 2A:
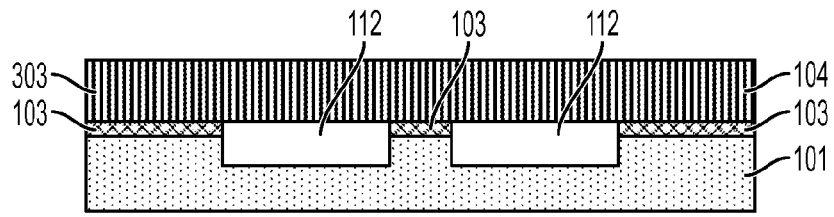
FIGS. 2A-2E are diagrams which illustrate a series of cross-sections illustrating processing steps to build the electric coupling from handle layer to MEMS device layer ready to bond to a base substrate for the device of FIG. 1.
Figure 2B:
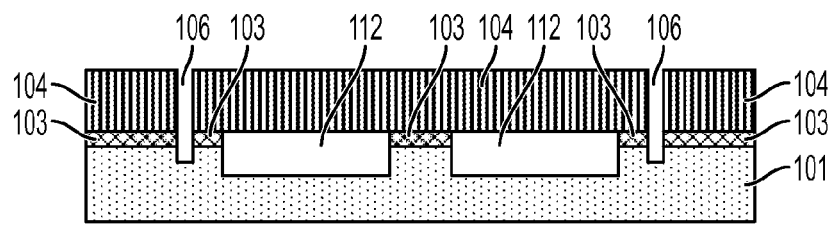
Figure 2C:
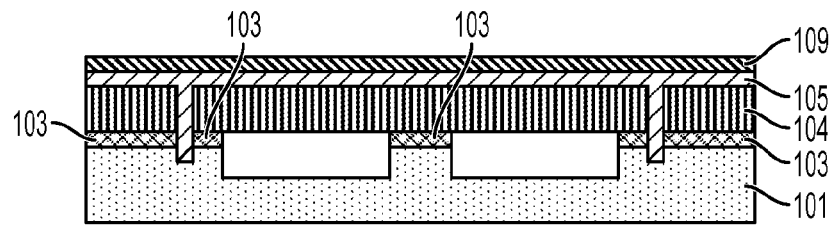
Figure 2D:
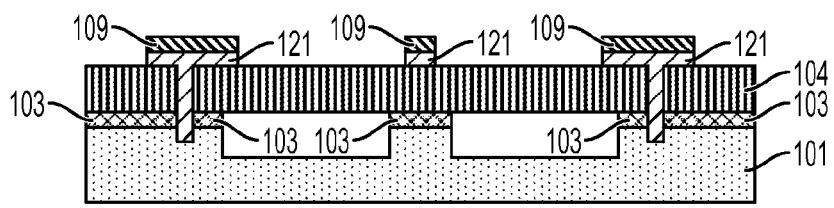
Figure 2E:
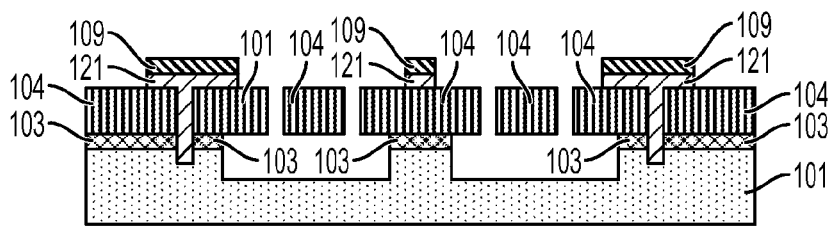

FIG. 2A is a diagram which illustrates the cross-section of an ESOI (engineered SOI) substrate with device layer 104 fusion-bonded to a handle silicon layer 101 with cavities 112. In an embodiment, as shown in FIG. 2B, vias 106 are patterned on device layer 104 of ESOI substrate and etched through device layer 104, through thin dielectric layer 103, and into handle layer 101. In another embodiment, vias 106 are patterned on device layer 104 of ESOI substrate and etched through device layer 104 and through thin dielectric layer 103 to expose a portion of the surface of handle layer 101. A conformal deposition of a conductive material 105 is then provided, as shown in FIG. 2C, to fill via 106 to establish electrical coupling between device layer 104 and handle layer 101. A germanium layer 109 is then deposited onto the conductive material 105. The next step shown in FIG. 2D is to pattern and etch conductive material 105 and germanium layer 109 to form standoffs 121 from the conductive material 105, followed by MEMS device layer 104 pattern and etch, as shown in FIG. 2E to complete the MEMS substrate processing, ready to bond to a base substrate. Alternately, the standoff 121 can be formed from both the conductive material 105 and a portion of the device layer 104 by partially etching into the device layer during standoff formation.

Figure 3:
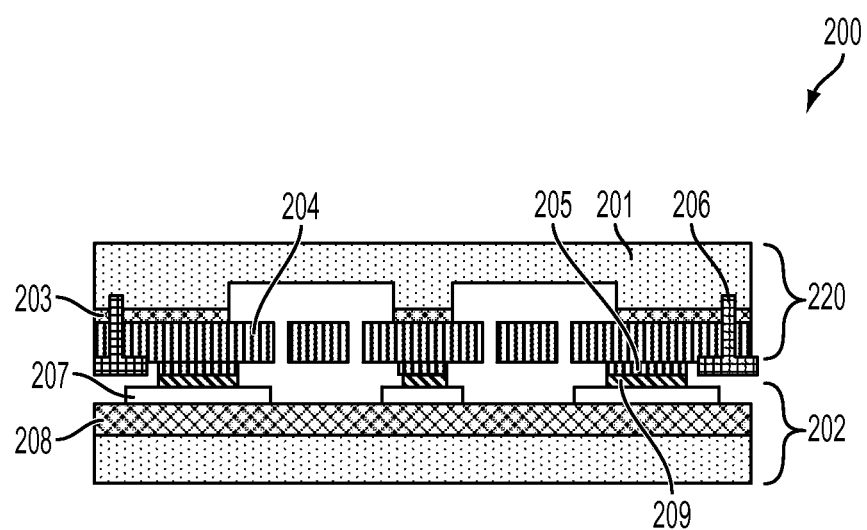
FIG. 3 is a diagram which illustrates a cross-section of the bonded MEMS-base substrate device with an internal direct electric coupling in accordance with a second embodiment.

FIG. 3 is a diagram which illustrates a cross-section of the bonded MEMS-base substrate device with an internal direct electric coupling in accordance with a second embodiment. In this embodiment, the electric coupling path is formed from handle layer 201 to MEMS device layer 204, across dielectric film 203, and eventually to base substrate Al pad 207 after MEMS to base substrate AlGe eutectic bonding.

An ESOI substrate 220 is comprised of a handle layer 201 with cavities 212 and a device layer 204, fusion bonded together with a thin dielectric layer 203 (such as silicon oxide) in between the device layer 204 and handle layer 201. The ESOI substrate is completed after device layer thinning. An electrical connection between handle layer 201 and device layer 204 can be achieved by etching at least one via 206 at any locations through device layer 204 and thin dielectric layer 203 into or exposing the surface of handle layer 201 and filling the via 206 by conductive materials, such as polysilicon, tungsten, titanium, titanium nitride, aluminum or germanium. In this embodiment, the remaining conductive materials on device layer 204 could be removed by thinning, polishing or etching-back to expose device layer for standoff formation 205. Steps of germanium deposition, standoff pattern, germanium etch, device layer 204 pattern, and etch, will be processed to complete the MEMS substrate.

The MEMS-base substrate integration is achieved by eutectic bonding of MEMS substrate with germanium pads 209 to base substrate with aluminum pads 207, where the AlGe bonding provides direct electrical coupling between MEMS substrate (handle 201 and device 204) and base substrate 202. In an embodiment, the standoff 205 forms a ring around the MEMS structure, the AlGe bond provides a hermetic seal for the MEMS structure. Via 206 can be positioned within or outside the seal ring formed by the standoff 205.

Figure 4:
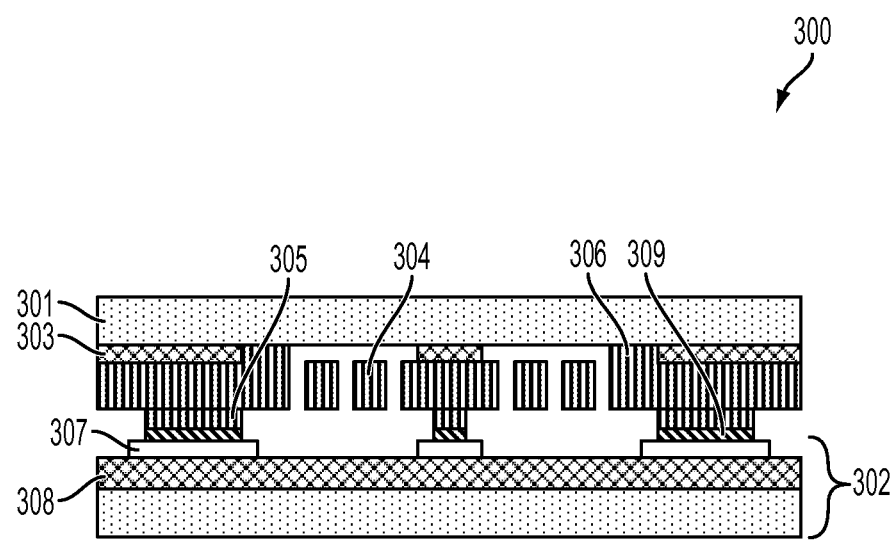
FIG. 4 is a diagram which illustrates a cross-section of the bonded MEMS-base substrate device with an internal direct electric coupling in accordance with a third embodiment.
Figure 5A:
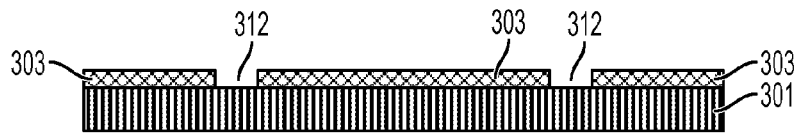
FIGS. 5A-5G are diagrams which illustrate a series of cross-sections illustrating processing steps to build the electric coupling from handle layer to MEMS device layer ready to bond to a base substrate for the device of FIG. 4.
Figure 5B:
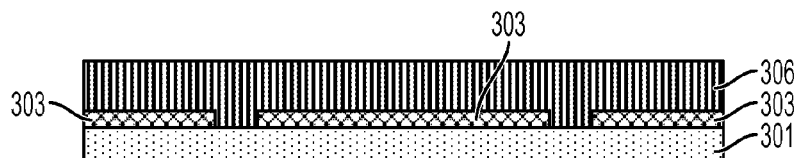
Figure 5C:
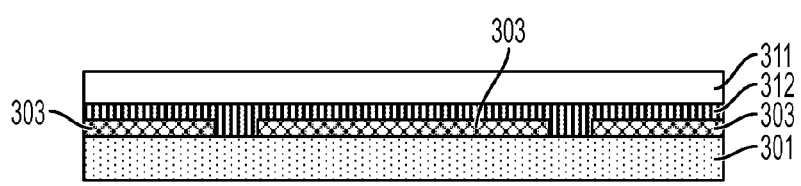

FIG. 4 is a diagram illustrating a third embodiment of the electric coupling between handle layer 301, MEMS device layer 304, and base substrate 302 using polysilicon for the device layer 304 and AlGe eutectic bonding. The process flow and fabrication method of MEMS substrate using a surface micro-machining process technique are illustrated in FIGS. 5A-5F. FIGS. 5A-5F are diagrams which illustrate a series of cross-sections illustrating processing steps to build the electric coupling from handle layer 301 to device layer 306 ready to bond to a base substrate 302 for the device of FIG. 4. Starting from FIG. 5A, a thin dielectric layer 303 (typically silicon oxide) is deposited on a handle layer 301. Thereafter the layer 303 is patterned and etched to form vias 312. A silicon layer 306 (FIG. 5B) is deposited onto the handle layer 301 followed by thinning and planarization, (for example grinding or chemical mechanical polishing) to desired device layer thickness. FIG. 5C illustrates an embodiment with a second thicker silicon device layer. In this embodiment, an additional silicon wafer 311 can be bonded to the thin polysilicon 312 and thinned down to desired device thickness. The bonding of the additional silicon wafer 311 overcomes thickness limitations from conventional deposition techniques.

Figure 5D:
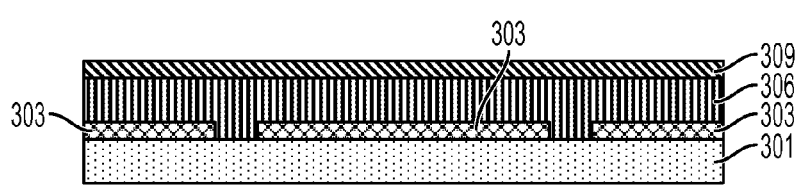
Figure 5E:
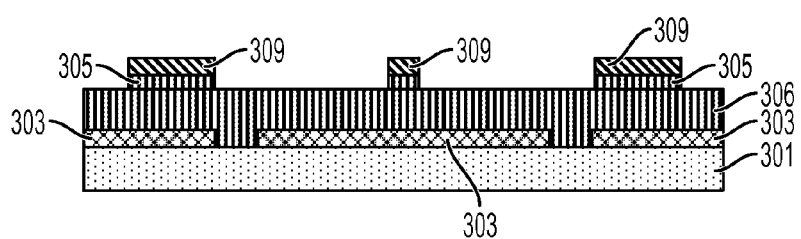
Figure 5F:
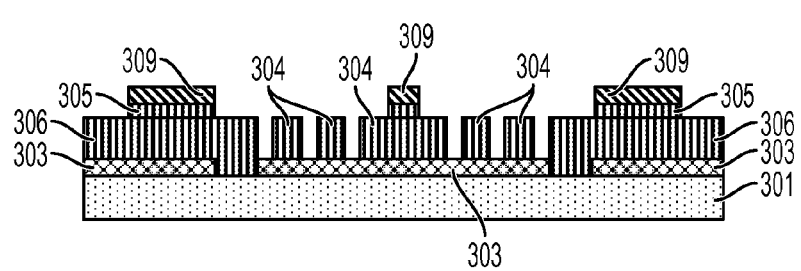
Figure 5G:
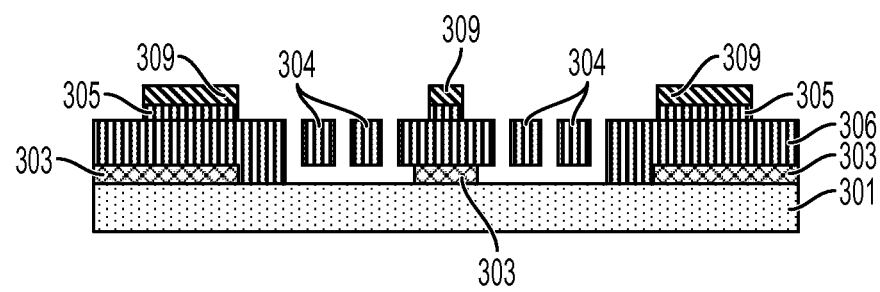

A Ge layer 309 is then deposited, as shown in FIG. 5D. FIG. 5E is a diagram which illustrates standoff 305 formation by patterning and etching into device layer 306. FIG. 5F is a diagram which illustrates patterning and etching silicon layer 306 to form MEMS structure 304. The patterning and etching step is followed by etching the silicon oxide to release the device layer 304 as shown in FIG. 5G. The MEMS substrate is now ready to be integrated with a base substrate.

As shown in FIG. 4, the MEMS-base substrate integration is achieved by eutectic bonding of MEMS substrate with germanium pads 309 to base substrate with aluminum pads 307, where the AlGe bonding provides direct electrical coupling between MEMS substrate (handle 301 and device 305) and base substrate 302. In addition, AlGe bonding provides hermetic vacuum seal of the MEMS device.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:
1. A MEMS device comprising:
   a MEMS substrate, the MEMS substrate includes a first semiconductor layer, a second semiconductor layer and a dielectric layer in between, the first semiconductor layer has a first and second surfaces, wherein the first surface is in contact with the dielectric layer;
   wherein MEMS structures are formed from the second semiconductor layer and
   includes a plurality of first conductive pads;

a base substrate which includes a plurality of second conductive pads thereon; wherein the second conductive pads are connected to the first conductive pads; and a conductive connector formed through only the dielectric layer, the second semiconductor layer and the first surface of the first semiconductor layer to provide electrical coupling between the first semiconductor layer and the second semiconductor layer, whereby the base substrate is electrically connected to the second semiconductor layer and the first semiconductor layer.

2. The MEMS device of claim 1, wherein the plurality of first conductive pads comprise germanium.

3. The MEMS device of claim 1, wherein the plurality of second conductive pads comprise aluminum.

4. The MEMS device of claim 1, wherein the MEMS substrate includes one or more etched vias filled by conductive material to form the conductive connector.

5. The MEMS device of claim 1 further comprising a seal ring, the seal ring comprising a continuous ring to form an enclosure surrounding the MEMS structures and formed by a connection of one of the first conductive pads and one of the second conductive pads.

6. The MEMS device of claim 5, wherein the first conductive pad is electrically connected to the first semiconductor layer.

7. The MEMS device of claim 5, wherein the conductive connector is positioned in the enclosure of the seal ring, or wherein the conductive connector is positioned outside the enclosure of the seal ring.

8. The MEMS device of claim 5, wherein the conductive connector is positioned within the seal ring.

9. The MEMS device of claim 1, wherein the connection between the first conductive pad and second conductive pad is a eutectic bond.

10. The MEMS device of claim 1, wherein the MEMS structures are electrically isolated from the first semiconductor layer.

11. The MEMS device of claim 4, wherein the conductive material filling the one or more vias comprises any of polysilicon, germanium, and tungsten, or wherein the conductive material filling the one or more vias comprises any of aluminum, titanium, and titanium nitride.

12. The MEMS device of claim 5, wherein the seal ring provides a hermetic seal.

13. The MEMS device of claim 1, wherein surface of the first semiconductor layer facing the second semiconductor layer includes cavities therein.

14. The MEMS device of claim 1, wherein the first semiconductor layer and the second semiconductor layer comprise any of single crystal silicon materials or polysilicon materials.

* * * * *